United States Patent Office 2,970,111

Patented Jan. 31, 1961

2,970,111

METHOD OF PRODUCING A ROD OF LOW-OHMIC SEMICONDUCTOR MATERIAL

Arnulf Hoffmann, Wolfgang Keller, and Konrad Reuschel, Pretzfeld, and Theodor Rummel, Munich, Germany, assignors to Siemens-Schuckertwerke Aktiengesellschaft, Berlin-Siemensstadt, Germany, a corporation of Germany No Drawing. Filed Sept. 21, 1959, Ser. No. 841,026

Claims priority, application Germany Sept. 20, 1958

12 Claims. (Cl. 252—62.3)

Our invention relates to a method for producing a rod of low-ohmic semiconductor material, particularly silicon, such as is required for manufacture of rectifiers, transistors and other electric semiconductor devices. It particularly relates to a method of imparting to the rod a predetermined electric conductance, by controlled doping with lattice defection atoms of the donor or acceptor type.

According to our invention, we proceed from a semiconductor rod having a known, relatively high impurity concentration and a relatively small cross section, and we precipitate upon such a rod a pure semiconductor material of the same type, preferably by reduction of a gaseous compound until the resulting cross section is a multiple of the original cross section and has the size corresponding to the desired reduction ratio of the impurity concentration. Thereafter we distribute the impurity concentration in the thickened semiconductor rod over the entire increased rod cross section by zone melting, preferably of the crucible-free type.

The prior methods for obtaining an intended uniform doping of a pretreated semiconductor rod with a quantity of impurity material accurately determined by weight, require the use of comprehensive special processing equipment, for example electrolytic plants, or evaporating apparatus with appertaining controlling and supervising devices. In contrast thereto, it is a more specific object and achievement of our invention to permit commencing the process with a semiconductor rod of any doping after determining its impurity concentration, for example by resistance measurement, and to produce a monocrystalline material of desired impurity concentration with the aid of simpler and normally available equipment, such as available for obtaining hyper-pure silicon by precipitation from a gaseous compound, and with the usual devices for zone melting. The disclosure of the application of Schweickert, Reuschel, and Gutsche, Serial No. 665,086, filed June 11, 1957, is included herein by reference. It describes a process of precipitating silicon or germanium or other semiconductor material upon a rod of the same material by decomposing a gaseous mixture of hydrogen and a halide, such as silicon tetrachloride, silicon hydrogen trichloride, and germanium tetrachloride, in contact with the rod, the rod being heated to decomposition temperature by electric current passing therethrough.

It is another advantage of the method according to the invention that it affords the production of doped semiconductor rods with an impurity concentration several decimal orders of magnitude lower, from original rods of higher concentration, regardless of the degree of accuracy in the manufacture of the doped original rods.

The doping of the original rod is preferably effected, in accordance with the application of Wolfgang Keller, Serial No. 818,519, filed June 8, 1959, by incorporating the doping material, particularly boron, into a body or filament of glass which is fused by heating upon the surface of a silicon rod and is subsequently uniformly distributed over the cross section by subjecting the rod to zone melting. By selecting the content of doping substance in the glass and the thickness of the glass filament being used, this method permits transferring a sufficient quantity of impurity substance into the semiconductor rod. Accordingly to another applicable method, the desired impurity substance is electrolytically deposited in uniform layer thickness upon the surface of a semiconductor rod and is thereafter uniformly distributed over the rod cross section by applying a zone melting method. In this manner an extremely low-ohmic rod of greatly uniform doping throughout its entire volume can be obtained.

The difficulty of reliably obtaining a predetermined conductance value by the effect of the doping substance, encountered with the above-mentioned other methods, is due to the fact that the required quantity of doping substance to be added can be kept at the accurate value only under difficult conditions and that the possible departures from a calculated amount of doping may cause considerable departures from the desired electric conductance. Such departures can be eliminated with the aid of the method according to the invention because it affords a reduction of the impurity concentration in a previously determined ratio. For example, the novel method permits reducing the impurity concentration by a single-stage operation in a ratio of 50:1. This corresponds, for example, to a diameter of 3 mm. of the original rod and a thickened diameter of 21 mm.

For producing an original rod of such a small thickness as 3 mm. diameter, for example, a thin rod may be drawn from a thicker semiconductor rod of already determined impurity concentration. The drawing-thin operation can be performed by continuously moving the rod ends away from each other during zone melting. In this manner, the original rod to be used for the method according to the invention proper can be given the cross section required to make the subsequent growth, up to a predetermined larger cross section of the finished rod, cause the impurity concentration to become diminished to the prescribed value.

The invention also admits of a particularly simple way of producing a starting rod in which an increased impurity concentration, suitable for obtaining the desired final results, is obtained by an only coarse doping process. Such a coarse method may consist, for example, in rubbing an impurity substance of solid constitution, for example, a piece of boron, along the semiconductor rod, particularly a silicon rod, prior to subjecting the rod to the above-mentioned drawing operation for reduction of its cross section. The amount of boron thus rubbed off and adhering to the rod can subsequently be uniformly distributed in the rod by zone melting.

When doping a silicon rod, for example with boron, it is feasible to purify the rod from undesired other impurities by repetitive zone melting in one and the other direction. This does not appreciably impair the uniform distribution of the boron along the rod, because the distribution coefficient of boron in silicon is about 0.9, and hence is sufficiently close to the unity value. Furthermore, a more uniform distribution of the impurity contration over the length of the thickened semiconductor rod can generally be obtained with crubile-free zone melting by moving the melting zone, during a few terminating passes, in alternating direction along the rod. Zone melting also offers the known possibility of obtaining the completed rod in form of a monocrystal by employing a monocrystalline crystal seed.

If the diameter of the thickened rod departs from a prescribed value, a correction can be obtained subsequently during the terminating zone melting by stretching or upsetting (compressing) the rod.

Upon completion of the zone melting, the resulting semiconductor rods of predetermined purity concentration can be used for repeating the method in order to again obtain further reduction in impurity concentration. In this manner, rods or groups of rods can be obtained in several stages of downwardly graduated impurity concentration, and the concentration obtained by the last processing stage may then be smaller than that of the original rod in a ratio of several powers of ten. This corresponds to an increase of the specific resistance in approximately the inverse ratio, as is illustrated, for example, by the following tabulation.

(1) The original rod has a specific resistance of 0.01 ohm cm.

(2) The first processing stage results in about 10 rods of 0.1 ohm cm. specific resistance.

(3) The second stage results, for each rod of the previous stage, in about 10 rods of 1 ohm cm. specific resistance.

(4) The third stage results, for each rod of the preceding stage, in about 10 rods of 10 ohm cm.

(5) The fourth stage results, for each rod of the preceding stage, in about 10 rods of 100 ohm cm.

Products of the third stage (10 ohm cm.) are applicable for special transistor types, for example. Products of the fourth stage (100 ohm cm.) are applicable, for example, for power transistors and photo-elements.

The above-described doping method according to the invention is applicable in principle with all known doping substances. For p-doping of silicon, gallium, aluminum, and boron are suitable. For n-doping of silicon, antimony, arsenic and phosphorus, for example, are suitable.

We claim:

1. A method for producing a rod of low-ohmic semiconductor material, for electrical semiconductor devices, having a predetermined conductance obtained by controlled doping, characterized in that, upon a semiconductor rod of known impurity concentration there is precipitated relatively purer semiconductor material of the same substance as the rod, until the thickened cross section is a multiple of the original cross section and corresponds to the desired reduction ratio of the impurity concentration, the impurity concentration of the semiconductor rod thus thickened being thereafter distributed over the entire rod cross section by zone melting.

2. A method for producing a rod of low-ohmic semiconductor material, having a predetermined conductance obtained by controlled doping, characterized in that, upon a semiconductor rod of known impurity concentration there is precipitated pure semiconductor material of the same substance as the rod until the thickened cross section is a multiple of the original cross section and corresponds to the desired reduction ratio of the impurity concentration, the impurity concentration of the semiconductor rod thus thickened being thereafter distributed over the entire rod cross section by zone melting, the original rod being produced by subjecting a thicker rod of previously measured impurity concentration to zone-melting, with simultaneously continuous moving apart of the rod ends to thin it.

3. The method defined in claim 2, the original rod being drawn to a thinness such that the subsequently precipitated layer of semiconductor material, which is hyperpure, results in a predetermined impurity concentration.

4. A method for producing a rod of low-ohmic semiconductor material, for electrical semiconductor devices, having a predetermined conductance obtained by controlled doping, characterized in that, upon a semiconductor rod of known impurity concentration there is precipitated relatively purer semiconductor material of the same substance as the rod, until the thickened cross section is a multiple of the original cross section and corresponds to the desired reduction ratio of the impurity concentration, the impurity concentration of the semiconductor rod thus thickened being thereafter distributed over the entire rod cross section by zone melting, the original rod being produced by rubbing with a solid impurity substance, and zone melting with simultaneous relative drawing apart of the rod ends to thin it.

5. A method for producing a rod of low-ohmic semiconductor material, for electrical semiconductor devices, having a predetermined conductance obtained by controlled doping, comprising subjecting a rod of previously measured impurity concentration to zone-melting with simultaneously continuous relative drawing apart of the rod ends to thin it to provide a semiconductor rod of smaller cross section, precipitating upon the rod relatively purer semiconductor material of the same substance as the rod, until the thickened cross section is a multiple of the original cross section and corresponds to the desired reduction ratio of the impurity concentration, the impurity concentration of the semiconductor rod thus thickened being thereafter distributed over the entire rod cross section by zone melting, the rod being thinned by drawing apart in the melting, precipitating said relatively purer semiconductor material on the thus thinned rod, and distributing the impurity concentration over the entire resulting cross section by zone melting, the rod ends being drawn apart relatively to again thin the rod.

6. A method for producing a rod of low-ohmic silicon semiconductor material, having a predetermined conductance obtained by controlled doping, characterized in that upon a silicon semiconductor rod of known impurity concentration there is precipitated pure silicon until the thickened cross section is a multiple of the original cross section and corresponds to the desired reduction ratio of the impurity concentration, the impurity concentration of the semiconductor rod thus thickened being thereafter distributed over the entire rod cross section by zone melting, the original rod being produced by subjecting a thicker rod of previously measured impurity concentration to zone-melting with simultaneously continuous moving apart of the rod ends to thin it.

7. A process of making a low-ohmic silicon semiconductor rod of a desired conductance, having a uniformly distributed doping impurity substance over the entire cross section thereof, comprising precipitating pure silicon upon the surface of a silicon rod that has a relatively high doping impurity concentration, the precipitating being by reduction of a gaseous compound of silicon and being carried out until the cross section of the rod has increased at least twice, the amount of silicon precipitated being chosen so that the resulting ratio of reduction of impurity concentration will provide the desired conductance, and thereafter zone melting to distribute the impurity over the entire rod cross section.

8. A process of making a monocrystalline silicon semiconductor rod of a desired conductance, having a uniformly distributed doping impurity substance over the entire cross section thereof, comprising over-doping a silicon rod, determining the resulting doping impurity concentration, precipitating silicon upon the surface of said silicon rod, the precipitating being by reduction of a gaseous halogen compound of silicon and being carried out until the cross section of the rod has increased at least twice, the amount of silicon precipitated being chosen so that the resulting ratio of reduction of impurity concentration will provide the desired conductance, and thereafter zone melting to distribute the impurity over the entire rod cross section, and in said process forming said monocrystalline crystal by seeding with a monocrystal.

9. A process of making a low-ohmic silicon semiconductor rod of a desired conductance, having a uniformly distributed doping impurity substance over the entire cross section thereof, comprising precipitating silicon upon the surface of a silicon rod that has a relatively high doping impurity concentration of boron, the precipitating being by reduction of a gaseous halogen compound of silicon and being carried out until the cross section of the rod has increased at least twice, the amount of silicon precipitated being chosen so that the resulting ratio of reduction of impurity concentration will provide the desired conductance, and thereafter zone melting to distribute the impurity over the entire rod cross section, and subjecting said rod to thinning by a melting-drawing operation.

10. A method for producing a semiconductor silicon rod having a predetermined conductance obtained by controlled doping, comprising subjecting a silicon rod of previously measured impurity concentration to zone-melting with simultaneously continuous relative drawing apart of the rod ends to thin it to provide a semiconductor rod of smaller cross section, precipitating relatively purer silicon on the rod until the thickened cross section is a multiple of the original cross section and corresponds to the desired reduction ratio of the impurity concentration, the impurity concentration of the semiconductor rod thus thickened being thereafter distributed over the entire rod cross section by zone melting, and again thinning the rod by zone melting and drawing apart, precipitating relatively purer silicon on the thus thinned rod, and distributing the impurity concentration over the entire resulting cross section by zone melting, the rod ends being drawn apart relatively to again thin the rod.

11. A method for producing a rod of low-ohmic semiconductor material, for electrical semiconductor devices, having a predetermined conductance obtained by controlled doping, comprising subjecting a rod of previously measured impurity concentration to zone melting with simultaneously continuous relative drawing apart of the rod ends to thin it to provide a semiconductor rod of smaller cross section, precipitating upon the rod relatively purer semiconductor material of the same substance as the rod until the thickened cross section is a multiple of the original cross section and corresponds to the desired reduction ratio of the impurity concentration, the impurity concentration of the semiconductor rod thus thickened being thereafter distributed over the entire rod cross section by zone melting, the rod being thinned by drawing apart in the melting, precipitating said relatively purer semiconductor material on the thus thinned rod, and distributing the impurity concentration over the entire resulting cross section by zone melting, the rod ends being drawn apart relatively to again thin the rod, the semiconductor material being silicon, the precipitation being by decomposing a gaseous mixture of hydrogen and a halogenide of silicon passed in contact with the rod, the rod being heated to decompose the gas mixture to silicon by passage of an electric current through the rod.

12. The method of claim 11, wherein the impurity is boron.

References Cited in the file of this patent

UNITED STATES PATENTS

| | | |
|---|---|---|
| 2,438,892 | Becker | Apr. 6, 1948 |
| 2,441,603 | Storks et al. | May 18, 1948 |
| 2,763,581 | Freedman | Sept. 18, 1956 |
| 2,785,095 | Pankove | Mar. 12, 1957 |
| 2,794,846 | Fuller | June 4, 1957 |
| 2,854,318 | Rummel | Sept. 30, 1958 |
| 2,876,147 | Kniepkamp | Mar. 3, 1959 |
| 2,910,394 | Scott et al. | Oct. 27, 1959 |